(12) United States Patent  
Ito

(10) Patent No.: US 7,907,256 B2  
(45) Date of Patent: Mar. 15, 2011

(54) STAGE APPARATUS, EXPOSURE APPARATUS, AND METHOD FOR MANUFACTURING DEVICE

(75) Inventor: Atsushi Ito, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 333 days.

(21) Appl. No.: 11/757,771

(22) Filed: Jun. 4, 2007

(65) Prior Publication Data

US 2007/0284950 A1 Dec. 13, 2007

(30) Foreign Application Priority Data

Jun. 9, 2006 (JP) ................. 2006-161644

(51) Int. Cl.
*G03B 27/42* (2006.01)
*G03B 27/58* (2006.01)
*G03B 27/62* (2006.01)
*H02K 41/02* (2006.01)

(52) U.S. Cl. ............ 355/72; 355/53; 355/75; 310/12.06

(58) Field of Classification Search .................. 318/590, 318/592, 593, 649; 355/53, 72, 75, 77; 310/12.01–12.06, 12.16, 12.19, 12.27

See application file for complete search history.

(56) References Cited

U.S. PATENT DOCUMENTS

| 2001/0050341 A1* | 12/2001 | Kwan et al. ................ 250/491.1 |
| 2003/0007140 A1 | 1/2003 | Korenaga |
| 2005/0186064 A1* | 8/2005 | Nishimura ..................... 414/935 |

FOREIGN PATENT DOCUMENTS

| JP | 2006-022960 A | 1/2003 |
| JP | 2005-243810 A | 9/2005 |

\* cited by examiner

*Primary Examiner* — Hung Henry Nguyen  
*Assistant Examiner* — Colin Kreutzer  
(74) *Attorney, Agent, or Firm* — Canon U.S.A., Inc. I.P. Division

(57) ABSTRACT

At least one exemplary embodiment is directed to a stage apparatus which comprises a first stage that is movable with respect to a horizontal plane that is defined by a first axis and a second axis that intersect each other at right angles, and a second stage that is movable on the first stage at least in the axial direction and in a rotational direction around a third axis, where a regulating member for restricting a movable range of the second stage is provided at a location in which a movable unit of the second stage faces the first stage through a gap.

4 Claims, 12 Drawing Sheets

UPPER END OF Z STROKE

LOWER END OF Z STROKE

STAGE APPARATUS, EXPOSURE APPARATUS, AND METHOD FOR MANUFACTURING DEVICE

CROSS-REFERENCE TO RELATED APPLICATIONS

This application claims the benefit of, and priority to, Japanese Patent Application No. 2006-161644, filed Jun. 9, 2006, which is hereby incorporated by reference in its entirety.

BACKGROUND OF THE INVENTION

1. Field of the Invention

This invention relates to a stage apparatus, and more particularly, though not exclusively, to a stage apparatus that can be used in a semiconductor exposure apparatus and a machine tool.

2. Description of the Related Art

Conventionally, an apparatus called a stepper and an apparatus called a scanner have been known as parts of an exposure apparatus used for semiconductor devices. A stepper moves a semiconductor wafer on a stage apparatus in stepped movements under a projection lens so that a pattern image formed on a reticle can be projected in a smaller scale with an exposure light through a projection lens and sequentially exposed onto a plurality of exposure areas on the single wafer. Meanwhile, a scanner moves a wafer on a wafer stage and a reticle on a reticle stage relative to a projection lens and applies an exposure light in a slit shape during scanning movements so that a reticle pattern is projected onto the wafer.

These days, as semiconductor devices become increasingly miniaturized and highly integrated, higher positioning accuracy and higher speed for improved productivity are in demand for stage apparatuses.

FIGS. 8A and 8B are an exploded perspective view and an assembly drawing of a conventional stage apparatus.

Main components of a wafer stage include a coarse moving stage 90 that is provided with X coarse moving linear motors 91 and Y coarse moving linear motors 92 for moving a coarse moving slider 93 in the direction of the X and Y axes in long strokes and a fine moving stage 100 for precision positioning. The fine moving stage 100 is laid out on the coarse moving slider 93 through a coarse moving stage top panel 120, and a fine moving stage top panel 101 is controlled directly with the linear motors in six axial directions.

FIGS. 9A to 9C are an exploded perspective view of the fine moving stage top panel and an exploded perspective view and an assembly drawing of the fine moving stage shown in FIGS. 8A and 8B.

The fine moving stage top panel 101 has the outer shape of a rectangular plate, and is provided with a wafer chuck 102 for mounting a wafer in its center.

The fine moving stage top panel 101 has seven linear motors 106 to 112 installed on its bottom surface between the bottom surface and the coarse moving stage top panel 120. Among the seven linear motors, three linear motors 106 to 108, which are laid out on the peripheral edges of the fine moving stage top panel 101, form a Z linear motor that generates a thrust in the direction of the Z axis in the figure. The remaining four linear motors 109 to 112 are laid out in the approximate center of the fine moving stage top panel 101. Among these, two linear motors 109 and 110 form an X linear motor that generates a thrust in the direction of the X axis in the figure, and the remaining two linear motors 111 and 112 form a Y linear motor that generates a thrust in the direction of the Y axis.

By driving these linear motors in combination, a driving force can be generated without contact in the six axis directions, X, Y, Z, θx, θy, and θz.

In addition, the fine moving stage top panel 101 is provided with mirrors 103 to 105 on its sides for reflecting a laser of an interferometer so that the position of the wafer chuck 102 can be measured. More specifically, a total of six optical beams, not shown, are applied to the fine moving stage top panel 101 to measure in six degrees of freedom the position of the fine moving stage top panel 101. With two beams of the interferometer that are parallel to the X axis but are different in Z position, the position in the direction of the X axis and the amount of rotation in the θy direction are measured. With three beams of the interferometer that are parallel to the Y axis but are different in X position and in Z position, the position in the direction of the Y axis and the amount of rotation in the θx and θz directions are measured. Likewise, with a beam applied to a surface portion of the mirror (104), the position in the direction of the Z axis is measured. Although in fact the values measured with these beams are not independent but interfere with one another, by performing a coordinate transformation as a rigid body, X, Y, Z, θx, θy, and θz of a representative position can be measured.

The above-mentioned linear motors and measurement system make it possible to control the fine moving stage 100 to be a desired position in six degrees of freedom.

In addition, an electromagnetic actuator that applies an acceleration force to the fine moving stage according to acceleration and deceleration of the coarse moving stage is provided between the fine moving stage and the coarse moving stage so that an acceleration force is applied to the fine moving stage in the deceleration and acceleration section of the coarse moving stage.

The electromagnetic actuator comprises an I core 204 and an E-shaped electromagnet 206 (an E core 207 and a coil 208). A gap between the E core 207 and the I core 204 is as small as several tens of microns, and, generally speaking, compared to linear motors, a large force can be generated with a much smaller current. The thrust generated by the electromagnetic actuator is in the direction normal to the surface the E core facing the I core. Since the E-shaped electromagnet 206 can only generate an attraction, an electromagnet for generating an attraction on a positive (+) side and an electromagnet for generating an attraction on a negative (−) side are provided for each of the directions of the X and Y axes.

Furthermore, by making the I core 204 in an arc shape around the Z axis and by making the end face of the letter E of the E core 207 in an arc shape around the Z axis, the four I cores and the four E cores can freely rotate around the Z axis without contacting one another. This eliminates any change in the gap during rotation, and therefore there is no change in the attraction generated by the electromagnet with the same current.

In addition, the I core 204 and the E core 207 are formed by layering thin plates while keeping the layers electrically isolated so that an eddy current is prevented from flowing within the yoke as magnetic flux changes occur. This makes it possible not only to control attractions up to high frequencies, but also to reduce heat generation caused by an eddy current.

Furthermore, by laying out a line of action of the force generated by the electromagnetic actuator at a location that approximately corresponds to the center of gravity in the direction of the Z axis and in the direction of the X or Y axis of the movable unit of the fine moving stage as a whole, application of an unnecessary rotation force to the fine moving stage is prevented. This eliminates the need for the linear motors to compensate for the unnecessary rotation force so as to make it possible to suppress heat generation of the motors.

As mentioned above, by having the electromagnetic actuator take charge of acceleration forces of the fine moving stage and generate acceleration forces in a precise manner, the heat generation can be suppressed of the linear motors and to suppress variation errors of the interferometer and deteriorations in stage positioning accuracy due to thermal expansion and other effects.

A coil spring 121 is provided between the fine moving stage and the coarse moving stage so that the weight of the wafer top panel 101 is supported. Thus, the Z fine moving linear motor described above does not need to generate a thrust for supporting the weight of the wafer top panel 101, and needs only to generate a small force for correcting a deviation from a target position. Refer to Japanese Patent Laid-Open No. 2003-022960 for an example.

One can use a stage apparatus to secure a stroke necessary for the apparatus, and to restrict excessive movement determined by constraints of the apparatus.

For example, for a stroke necessary for a fine moving stage in an exposure apparatus, there are minute rotations around the X and Y axes to allow exposure light to intersect at right angles with a wafer so that a normal pattern image is printed with respect to the shape of the wafer surface. In addition, there are other rotations including a minute rotation around the Z axis for correcting deviations in rotational position at the early stage when the wafer is fixed to the wafer chuck.

Meanwhile, as to the amounts of movement, an excessive amount of translational movement is conceivable. In examples shown in FIGS. 8A, 8B, and 9A to 9C, the gap between the fine moving stage and the coarse moving stage is the gap between the E core 207 and the I core 204 of the electromagnetic actuator, which represents the smallest gap, and is as small as several tens of microns. Because of this, in an assembly stage and in a preparation stage for controls such as debugging, and during adjustment, it can be difficult to maintain the gap between the I core 204 and the E core 207, and they may contact each other. In case of such a contact, the I core 204 and the E core 207 may incur an indentation or wear. This may cause a local change in the gap between the I core 204 and the E core 207, making it difficult to generate an accurate acceleration force, which can deteriorate positioning accuracy.

In addition, the stage apparatus can become uncontrollable due to the effects incurred from unexpected disturbance and the stage apparatus, in a precisely controlled state, instantly goes into a servo off state due to an emergency stop. Thus, the I core 204 and the E core 207 of the electromagnetic actuator, which correspond to the smallest gap between the coarse moving stage and the fine moving stage, can collide with each other and cause the electromagnetic actuator to break. It is thus necessary to prevent damage or breakage of the actuator to achieve stable driving of the stage apparatus.

Since both an exposure apparatus and a stage apparatus are generally provided with many components such as refrigerant piping for cooling, electric cable and sensor, excessive amounts of translational and rotational movement which can damage the components, also becomes a problem. In particular, in a wafer stage, it can be necessary to relatively move an unshown three-pin for wafer replacement in a stroke in the direction of the z axis relative to the fine moving stage, and when the three-pin is fixed, the fine moving stage can be moved in a stroke in the direction of the Z axis in the order of several millimeters. Thus, it is useful to secure a stroke in the direction of the Z axis and to suppress excessive amounts of translational and rotational movement in the direction of the other axes.

SUMMARY OF THE INVENTION

At least one exemplary embodiment of the present invention is directed toward a stage apparatus that can restrict the amount of movement in the directions of the axes and in the rotational directions around the axes of a fine moving stage with respect to a coarse moving stage.

At least one exemplary embodiment is directed to a stage apparatus comprising: a first stage that is movable with respect to a horizontal plane that is defined by a first axis and a second axis that intersect each other at right angles; and a second stage that is movable on the first stage at least in the axial direction and in a rotational direction around a third axis, where a regulating member for restricting a movable range of the second stage is provided at a location in which a movable unit of the second stage faces the first stage through a gap.

At least one exemplary embodiment is directed to an exposure apparatus configured to expose a pattern image of a reticle on a substrate through a projection optical system comprising: an illumination unit that illuminates the reticle so that the pattern image is formed; and the stage apparatus defined above; wherein the substrate and/or the reticle is relatively moved by the stage apparatus for exposure.

At least one exemplary embodiment is directed to a device manufacturing method comprising: a step of exposing a substrate through a reticle using the exposure apparatus defined above; a step of developing the exposed substrate; and a step of manufacturing a device by processing the developed substrate.

At least one exemplary embodiment of the present invention can restrict the movable ranges in the directions of the axes and in the rotational directions around the axes of the fine moving stage (e.g., a second stage) with respect to the coarse moving stage (e.g., a first stage). Thus, at least one exemplary embodiment prevents or reduces damage to a stage apparatus, by restricting the excessive amounts of movement while securing the strokes necessary for the stage apparatus.

Further features of the present invention will become apparent from the following description of exemplary embodiments with reference to the attached drawings.

DESCRIPTION OF THE EMBODIMENTS

Hereinafter, at least one exemplary embodiment of the present invention will be described in detail with reference to the attached drawings.

The exemplary embodiment explained below is considered as an example for implementing at least one exemplary embodiment of the present invention and should be modified or changed as appropriate according to the configuration of an apparatus to which the exemplary embodiment is applied and other conditions.

[Description of Stage Apparatus]

First of all, a stage apparatus according to at least one exemplary embodiment of the present invention will be explained.

Figure 1A:
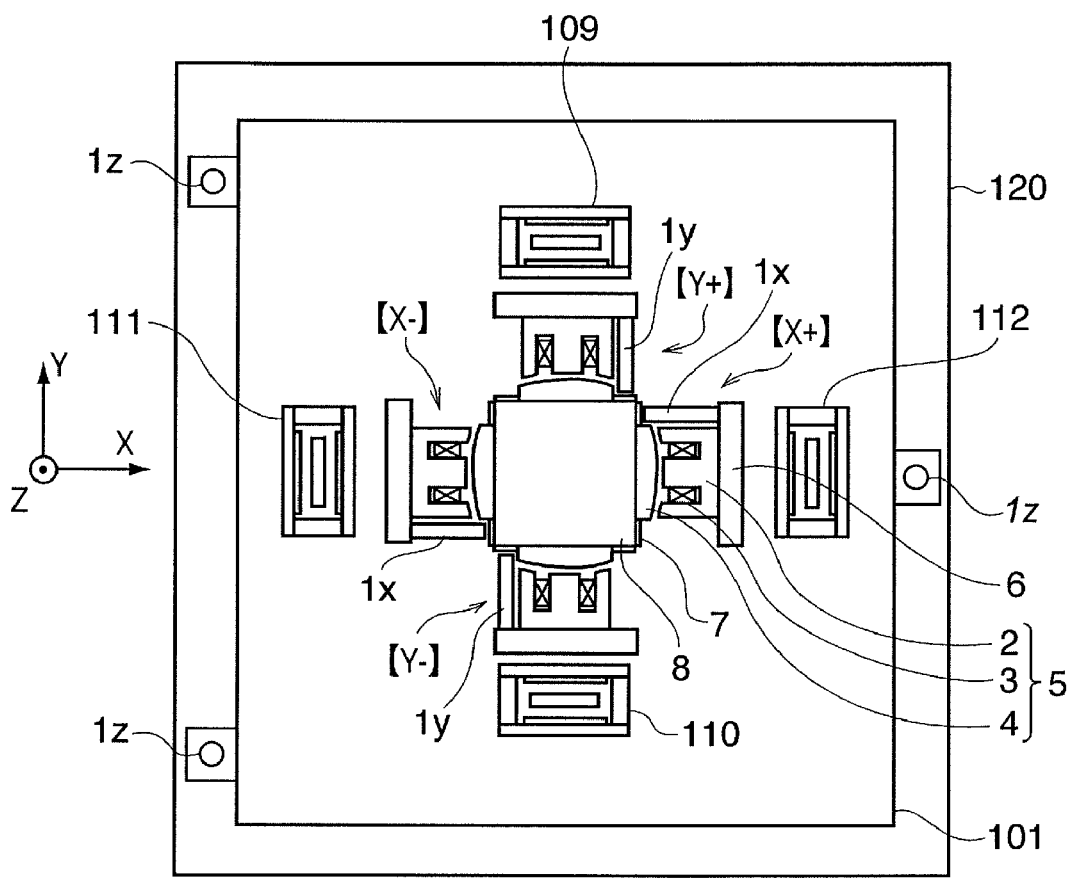
FIG. 1A is a plan view of a stage apparatus according to at least one exemplary embodiment of the present invention.
Figure 1B:
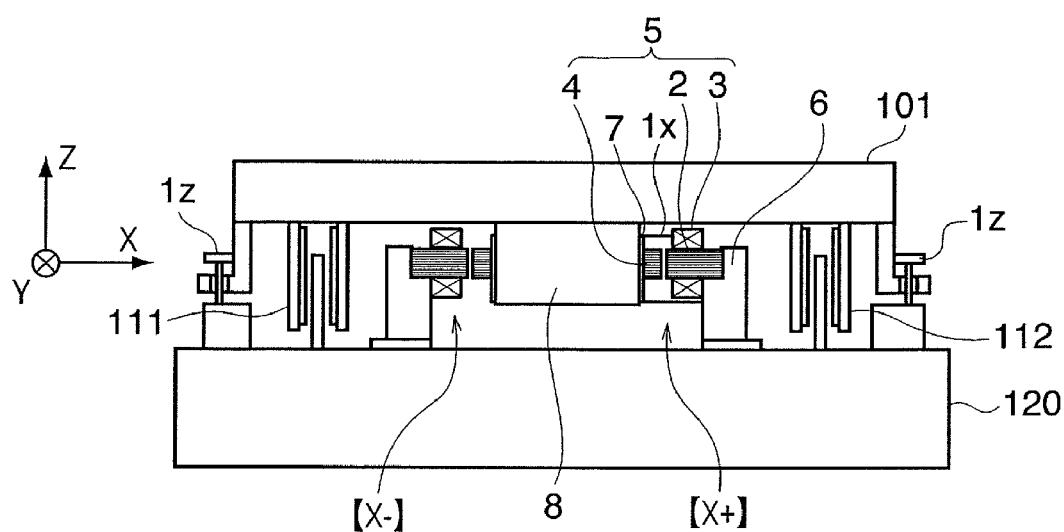
FIG. 1B is a sectional side view of a stage apparatus according to the exemplary embodiment illustrated in FIG. 1A.

FIGS. 1A and 1B are illustrations of a stage apparatus according to the exemplary embodiment, and are a plan view when viewed through a fine moving stage top panel and a sectional side view along the ZX plane.

The stage apparatus according to the exemplary embodiment is useful especially as a wafer stage for a semiconductor exposure apparatus.

Figure 8B:
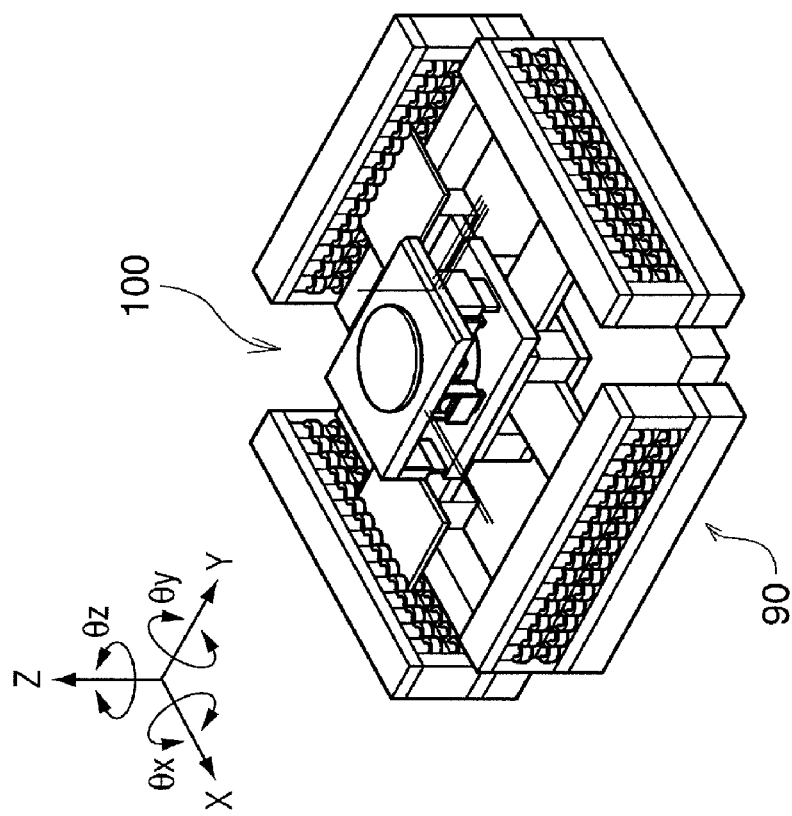
FIG. 8B is an assembly drawing of a conventional stage apparatus.
Figure 8A:
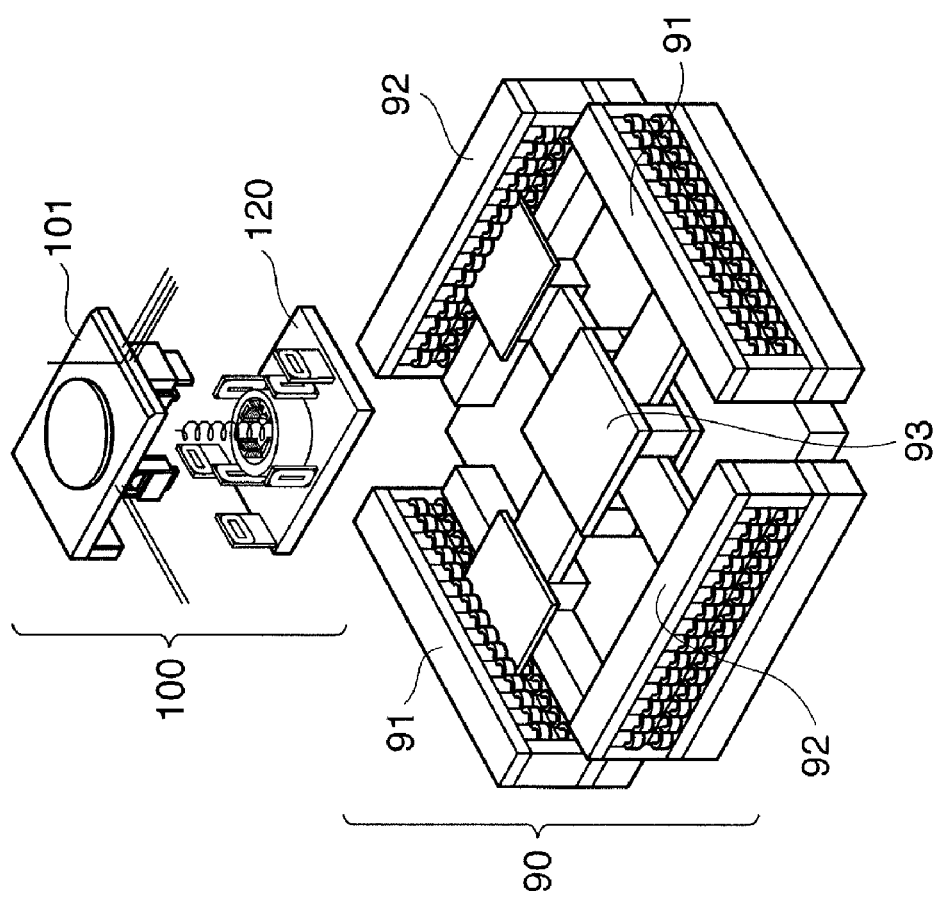
FIG. 8A is an exploded perspective view of a conventional stage apparatus.

As shown in FIGS. 1A and 1B, a fine moving stage top panel 101, which is movable in fine strokes with six degrees of freedom, is mounted on a coarse moving stage top panel 120 that can be moved by unshown coarse moving linear motors (for example, see FIGS. 8A and 8B) in long strokes with respect to the XY plane.

Figure 9C:
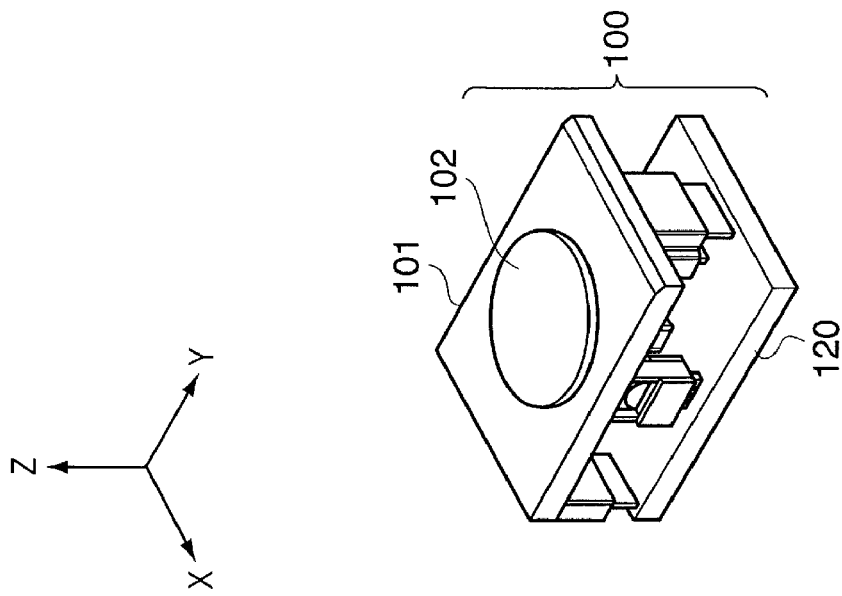
FIG. 9C is an assembly drawing of the fine moving stage shown in FIGS. 8A and 8B.
Figure 9B:
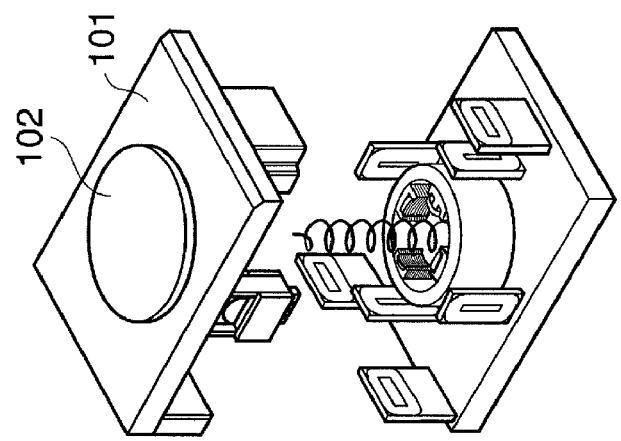
FIG. 9B is an exploded perspective view of the fine moving stage shown in FIGS. 8A and 8B.
Figure 9A:
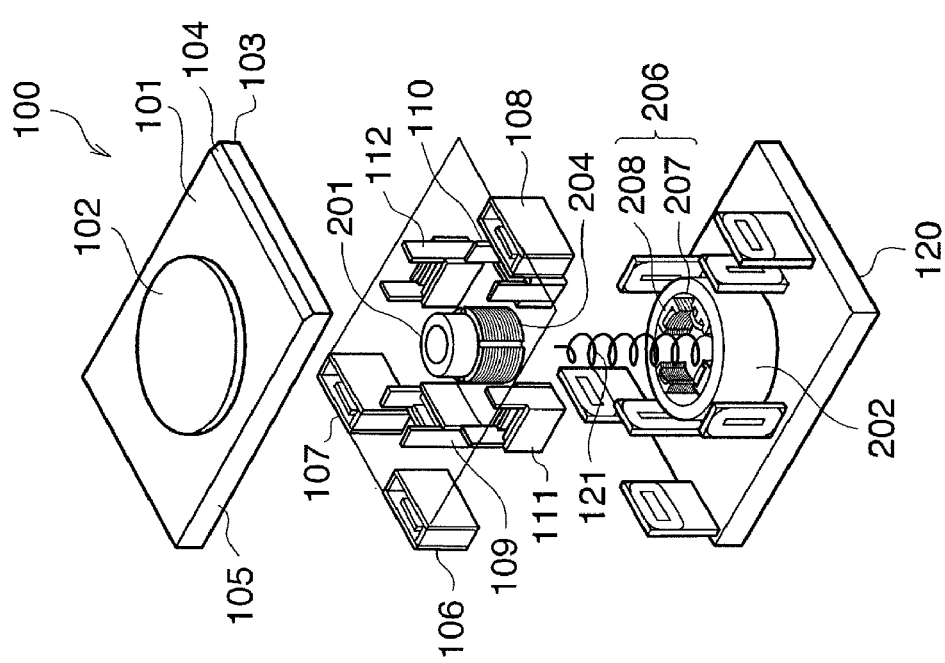
FIG. 9A is an exploded perspective view of the fine moving stage top panel shown in FIGS. 8A and 8B.

The fine moving stage top panel 101 has seven linear motors (see 106 to 112 in FIGS. 9A to 9C) installed on its bottom surface between the bottom surface and the coarse moving stage top panel 120. Among the linear motors, three linear motors 106 to 108 that are laid out on the peripheral edges of the fine moving stage top panel 101 form a Z fine moving linear motor that generates a thrust in the direction of the Z axis in the figure. The remaining four linear motors 109 to 112 are laid out in the approximate center of the fine moving stage top panel 101. Among these, two linear motors 109 and 110 form a X fine moving linear motor that generates a thrust in the direction of the X axis shown in the figure, and the remaining two linear motors 111 and 112 form a Y fine moving linear motor that generates a thrust in the direction of the Y axis. By driving these linear motors in combination, a driving force can be generated without contact in the directions of the six axes, the direction of the X axis, the direction of the Y axis, the direction of the Z axis, the rotational direction θx around the X axis, the rotation al direction θy around the Y axis, and the rotational direction θz around the Z axis.

In addition, an electromagnetic actuator 5 that gives an acceleration or deceleration force to the fine moving stage top panel 101 according to acceleration and deceleration of the coarse moving stage top panel 120 is provided between the fine moving stage top panel 101 and the coarse moving stage top panel 120. The electromagnetic actuator 5 gives acceleration and deceleration forces to the fine moving stage top panel 101 in the acceleration and deceleration section of the coarse moving stage top panel 120.

The electromagnetic actuator 5 comprises an I core 4, an E core 2, and a coil 3. The E core 2 and the I core 4 are laid out to face each other with a gap (e.g., several tens of microns) between them so that an attraction is generated between the E core 2 and the I core 4. The E core 2 and the coil 3 are mounted to a support member 6, and the I core 4 is mounted to a support member 7. In FIGS. 1A and 1B, two each of the electromagnetic actuators 5 are laid out in the direction of the X axis and in the direction of the Y axis. In other words, four of them are laid out, one each on the X+ side, X− side, Y+ side, and Y− side. With this, attractions are generated at both + and − sides of the directions of the X and Y axes so as to make it possible to give a thrust to the fine moving stage top panel 101 with respect to all acceleration and deceleration directions of the coarse moving stage top panel 120.

[Description of Regulating Member]

Hereinafter, a regulating member that is a feature of the exemplary embodiment will be explained.

Figure 2:
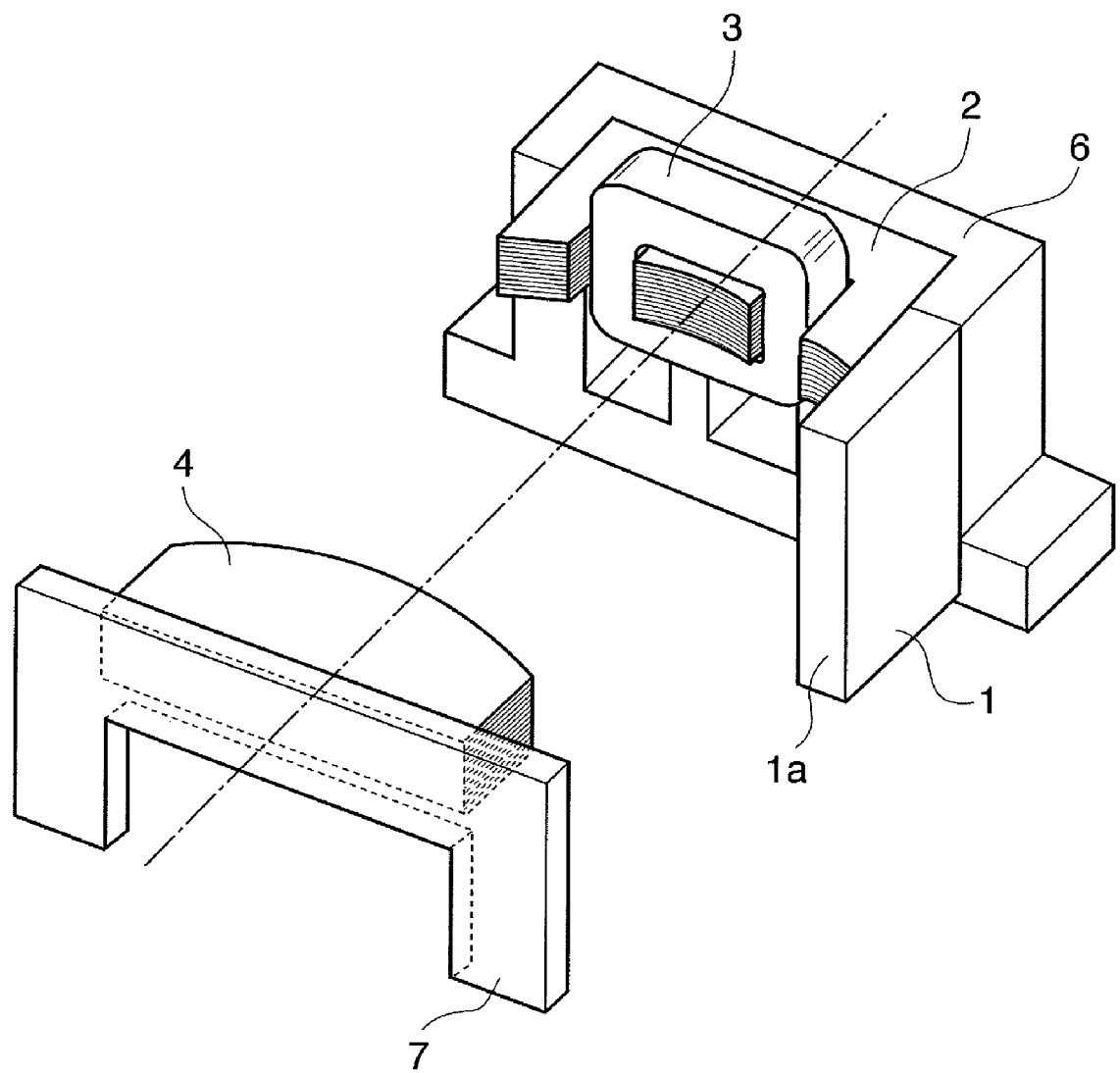
FIG. 2 is a perspective view that illustrates in an enlarged view a portion surrounding the electromagnetic actuator shown in FIGS. 1A and 1B.
Figure 5A:
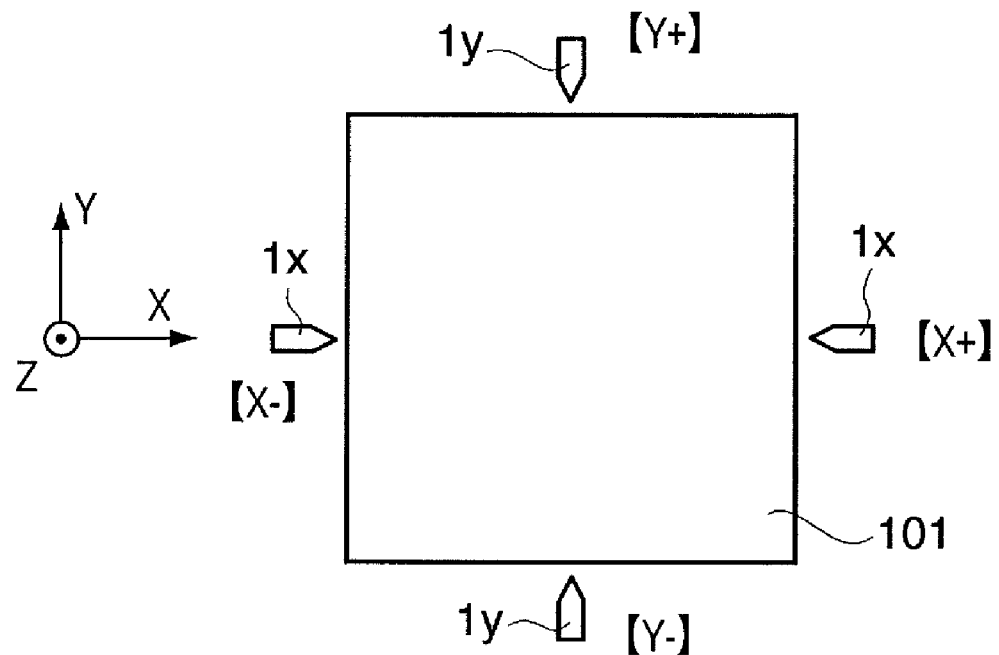
FIG. 5A is a plan view that schematically illustrates a regulating member according to the exemplary embodiment of FIG. 1A.
Figure 5B:
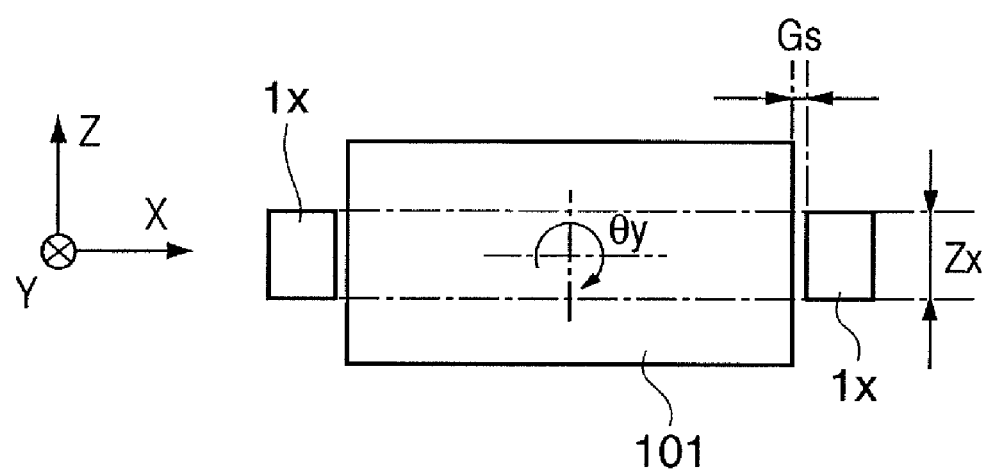
FIG. 5B is a side view that schematically illustrates a regulating member according to the exemplary embodiment of FIG. 1A.
Figure 6A:
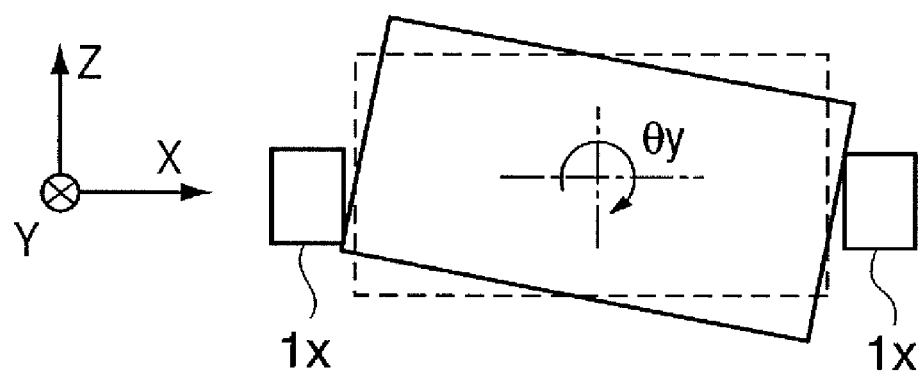
FIGS. 6A and 6B are side views of a regulating member according to the exemplary embodiment of FIG. 1A that illustrate a state in which the rotation around the Y axis is regulated when the fine moving stage is stroked in the direction of the Z axis.
Figure 6B:
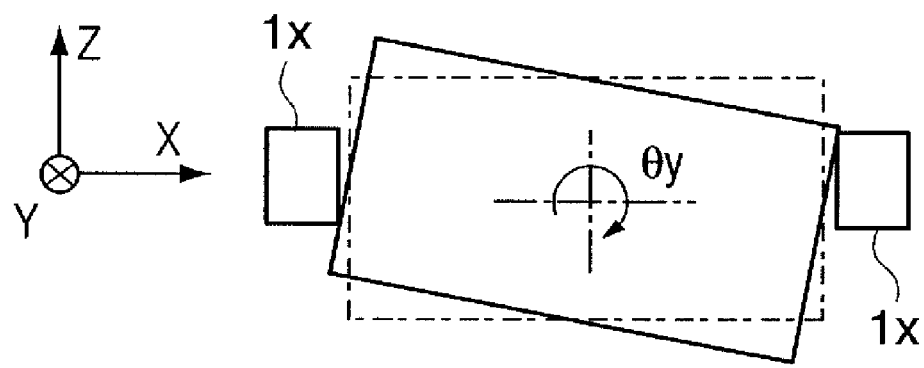
Figure 7A:
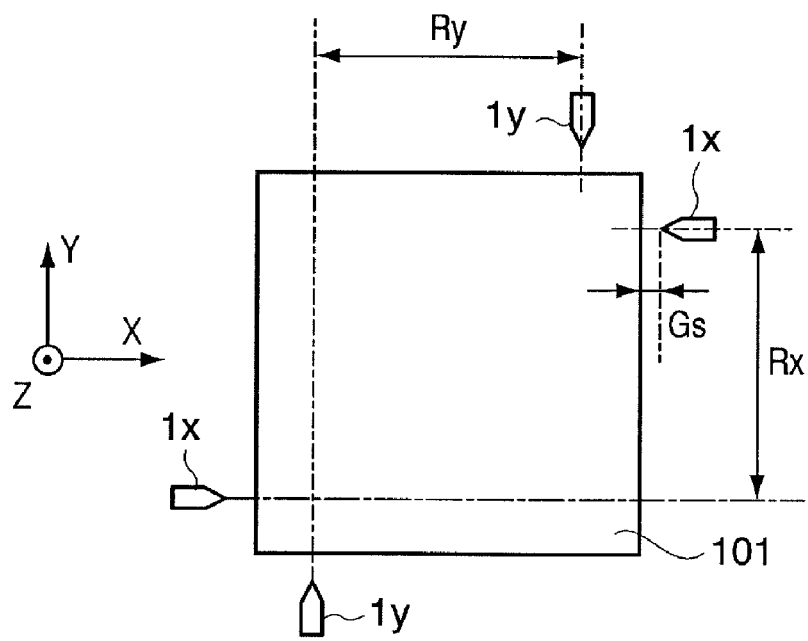
FIGS. 7A and 7B are plan views of a regulating member according to the exemplary embodiment of FIG. 1A that illustrate a state in which the rotation around the Z axis of the fine moving stage is regulated.
Figure 7B:
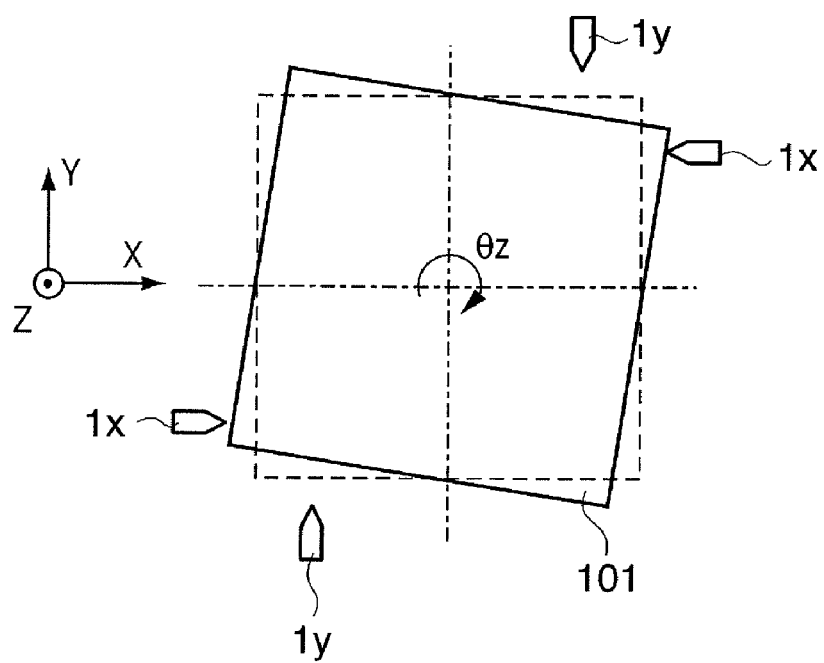

FIG. 2 is a perspective view that illustrates in an enlarged view a portion surrounding the electromagnetic actuator 5 shown in FIGS. 1A and 1B. FIGS. 5A and 5B are a plan view and a side view that schematically illustrate a regulating member according to the exemplary embodiment. FIGS. 6A and 6B are side views of a regulating member according to the exemplary embodiment that illustrates a state in which the rotation around the Y axis is regulated when the fine moving stage is stroked in the direction of the Z axis. FIGS. 7A and 7B are plan views of a regulating member according to the exemplary embodiment that illustrates a state in which the rotation around the Z axis of the fine moving stage is regulated.

In FIG. 2, a regulating member 1 is mounted to an E core support member 6 of the coarse moving stage top panel 120. This is laid out on the X+ side, the X− side, the Y+ side, and the Y− side shown in FIG. 1A.

A tip portion 1a of the regulating member 1 faces with a predetermined gap a support plate 7 for mounting the I core to the fine moving stage top panel 101. The size of the gap between the tip portion 1a of the regulating member 1 and the support plate 7 (regulation gap Gs shown in FIG. 5B) is determined so as to define the minimum value of the gap between the coarse moving stage top panel 120 and the fine moving stage top panel 101.

The above-mentioned regulation gap is set to be smaller than the gap between the E core 2 and the I core 4, which is the smallest gap between the coarse stage and the fine moving stage other than the regulating member 1 shown in FIGS. 1A and 1B. This makes it possible to prevent and/or reduce the occurrence of a contact or collision in connection with not only the E core 2 and the I core 4 but also all components of the coarse moving stage and of the fine moving stage.

The regulating member 1 is laid out so as to face the support plate 7 through a regulation gap so that the regulating member 1 is prevented from directly contacting and damaging the fine moving stage top panel 101 when a material such as ceramics is selected for the fine moving stage top panel 101 from the viewpoint of weight reduction or stiffness.

The regulating member 1 has X regulating members 1$x$, Y regulating members 1$y$, and Z regulating members 1$z$. The X regulating members 1$x$ define the minimum value of the regulation gap in the direction of the X axis between the coarse moving stage top panel 120 and the fine moving stage top panel (movable unit) 101. The Y regulating members 1$y$ define the minimum value of the regulation gap in the direction of the Y axis between the coarse moving stage top panel 120 and the fine moving stage top panel 101. The Z regulating members 1$z$ define the minimum value of the regulation gap in the direction of the Z axis between the coarse moving stage top panel 120 and the fine moving stage top panel 101. The Z regulating members 1$z$ are laid out on the peripheral edges of the coarse moving stage top panel 120 and on the side edges of the fine moving state top panel 101.

The X regulating members 1$x$ and the Y regulating members 1$y$ regulate the movable ranges in the direction of the X and Y axes as well as the movable ranges in the three rotational directions: $\theta x$ around the X axis, $\theta y$ around the Y axis, and $\theta z$ around the Z axis of the fine moving stage top panel 101.

In addition, the Z regulating members 1$z$ regulate the movable range in the direction of the Z axis of the fine moving stage top panel 101.

The X regulating members 1$x$ are laid out in parallel with the X axis so as to face each other so that the movable unit (a rectangular solid portion 8 that protrudes downward from the bottom surface of the fine moving stage top panel 101 so as to the support plate 7) is sandwiched between them. In addition, the X regulating members 1$x$ consist of a pair of beam-shaped members that extend in the direction of the Z axis (Z span Zx shown in FIG. 5B) by a predetermined distance while maintaining the regulation gap Gs in the direction of the X axis, and regulate the movable range in the rotational direction $\theta y$ around the Y axis of the fine moving stage top panel 101 as shown in FIGS. 6A and 6B.

Likewise, the Y regulating members 1$y$ are laid out in parallel with the Y axis so as to face with each other so that the movable unit of the fine moving stage top panel 101 is sandwiched between them. In addition, the Y regulating members 1$y$ consist of a pair of beam-shaped members that extend in the direction of the Z axis by a predetermined distance (Z span Zy) while maintaining the regulation gap Gs in the direction of the Y axis, and regulate the movable range in the rotational direction $\theta x$ around the X axis of the fine moving stage top panel 101.

The Z regulating members 1$z$ consist of three rod-shaped members that, in parallel with the Z axis, protrude from the top surface of the coarse moving stage top panel 120, and regulate the movable range in the direction of the Z axis of the fine moving stage top panel 101.

The movable unit of the fine moving stage includes the fine moving stage top panel 101 and an actuator that accompanies the fine moving stage.

By regulating the rotational directions $\theta x$ and $\theta y$ with the above-mentioned X regulating members 1$x$ and the Y regulating members 1$y$, the following advantages can be obtained. First of all, it has an effect of preventing or reducing damage caused by contact with other parts during assembly of the fine moving stage to the coarse moving stage and during maintenance. This is because the X and Y regulating members serve as a guide that suppresses the rotations in the rotational directions $\theta x$ and $\theta y$ when the fine moving stage is moved up and down in the direction of the Z axis.

Secondly, it has an effect of facilitating the sufficiency of a very small gap for the above-mentioned regulation gap. This is because the fine moving stage and the coarse moving stage are controlled so that their locations are aligned in the X and Y directions. In contrast, in the case where the rotational directions $\theta x$ and $\theta y$ are regulated by providing an X span or a Y span to the Z regulating members, since the fine moving stage has a stroke in the direction of the Z axis with respect to the coarse moving stage, the Z regulating members need a large regulation gap equivalent to the stroke. In order to achieve, with the Z regulating members, the regulation equivalent to the regulation of the amounts of rotation in the rotational directions $\theta x$ and $\theta y$ achieved with the X and Y regulating members, a very long span is necessary.

Furthermore, the pair of the beam-shaped members of the X regulating members 1$x$ that face with each other are laid out in parallel with the X axis and are spaced away from each other by a predetermined distance in the direction of the Y axis (X span Rx shown in FIG. 7A). In other words, the pair of the beam-shaped members of the regulating member 1$x$ are laid out in parallel with the direction of the X axis but not on the same line. Likewise, the pair of the beam-shaped members of the Y regulating members 1$y$ that face with each other are laid out in parallel with the Y axis and are spaced away from each other by a predetermined space in the direction of the X axis (Y span Ry shown in FIG. 7A). The pair of the beam-shaped members of the regulating member 1$y$ are laid out in parallel with the Y axis but not on the same line. The X regulating members 1$x$ and the Y regulating members 1$y$ work in cooperation to regulate the movable range in the rotational direction $\theta z$ around the Z axis of the fine moving stage top panel 101.

A span of the above-mentioned regulating members facilitates an effective length of a pair of the regulating members that regulates the rotation around an axis of the fine moving stage top panel 101, which, for example, represents a distance along the direction of the Y axis between the regulating members 1$x$ of a pair. The height in the direction of the Z axis of each of the regulating members 1$x$ of a pair on the X+ side and on the X− side corresponds to the Z span. The Z span of the regulating members 1$x$ and the regulation gap regulate the rotational direction $\theta y$ around the Y axis of the fine moving stage top panel 101. Likewise, the Z span of the regulating members 1$y$ and the regulation gap regulate the rotational direction $\theta x$ around the X axis of the fine moving stage top panel 101.

As mentioned above, by changing the layout (span) of the regulating members 1$x$ and 1$y$ that regulate the movable ranges in the directions of the X and Y axes as well as in the rotational directions $\theta x$ and $\theta y$ around each of these axes, the movable range in the rotational direction $\theta z$ around the Z axis can be regulated without increasing the number of the regulating members.

The movable range in the rotational direction with the above-mentioned regulating members can be calculated as follows.

For the sake of simplicity in the explanation below, the regulation gaps between the X regulating members 1$x$ of a pair and between the Y regulating members 1$y$ of a pair are both set to be the same Gs, the Z span of the X regulating members 1$x$ are set to be Zx, the Z span of the Y regulating members 1y are set to be Zy, and the Y span of the X regulating members 1x and the X spans of the Y regulating members 1y are set to be equally R.

Using the above-mentioned symbols, the amount of rotational regulation around the X axis can be represented as $\theta x \approx a \tan(2Gs/Zy)$, the amount of rotational regulation around the Y axis can be represented as $\theta y \approx a \tan(2Gs/Zx)$, and the amount of rotational regulation around the Z axis can be represented as $\theta z \approx a \tan(2Gs/R)$. Provided, $\theta x$, $\theta y$, and $\theta z$ are a very small amount.

Each of the parameters Gs, Zx, Zy, and R in the above-mentioned expressions can be determined so as to satisfy each of the strokes, in the translational directions of the X, Y, and Z axes and in the rotational directions $\theta x$, $\theta y$, and $\theta z$, that are required for a stage apparatus, and so as not to exceed the predetermined amounts of translational and rotational movements. Since the above-mentioned regulation gap Gs is necessary to be smaller than the gap (Ge) between the E core 2 and the I core 4, there is a limitation of Gs<Ge. Although many of the parameters in the above-mentioned explanation were set to the same values for simplicity, it is needless to say that each of them may be different values.

For example, in FIGS. 7A and 7B, the positive rotatable amount $+\theta z$ and the negative rotatable amount $-\theta z$ around the Z axis of the fine moving stage are $+\theta z \approx a \tan(2Gs/Ry)$ and $-\theta z \approx a \tan(2Gs/Rx)$, respectively. Here, $\theta z$ is very small. When different amounts of rotational regulation are set between the rotational directions, the Y span Ry of the X regulating members and the X span Ry of the Y regulating members may be set to different values.

The above-mentioned span can be defined by the length of the regulating member itself like the Z span in FIG. 5B. The members of a pair may be spaced away, or a different member may be introduced. The span may be configured in any way, taking into consideration the layout conditions in connection with other components of the stage apparatus.

Hereinafter, a method for setting parameters of the regulating members will be explained. The movable range of the stage can be set so that a predetermined stroke is achieved and so that it is smaller than a predetermined amount of regulation.

Examples of the predetermined stroke of a fine moving stage in an exposure apparatus are minute rotations around the X and Y axes for achieving an intersection at right angles between the exposure light and the wafer so that a normal pattern image is printed with respect to the shape of the wafer surface. Another example is a minute rotation around the Z axis for correcting deviations in rotational position at an early stage when the wafer is fixed to the wafer chuck.

On the other hand, an example of the predetermined amount of regulation is, first of all, an excessive amount of translational movement. In examples shown in FIGS. 8A, 8B, and 9A to 9C, the gap between the fine moving stage and the coarse moving stage is the gap between the E core 207 and the I core 204 of the electromagnetic actuator, which is the smallest gap, and is as small as several tens of microns. Because of this, in an assembly stage and a preparation stage for controls such as debugging, and during adjustment, it may be impossible to maintain the gap between the I core 204 and the E core 207, and they may contact with each other. In case of such a contact, the I core 204 and the E core 207 can incur an indentation or wear. This can cause a local change in the gap between the I core 204 and the E core 207, making it difficult to generate an accurate acceleration force, which can deteriorate positioning accuracy.

In addition, the stage apparatus can become incontrollable due to the effects incurred from unexpected disturbance and that the stage apparatus in a precisely controlled state instantly goes into a servo off state due to an emergency stop. Thus, the I core 204 and the E core 207 of the electromagnetic actuator, which correspond to the smallest gap between the coarse moving stage and the fine moving stage, can collide with each other and cause the electromagnetic actuator to break. It is thus necessary to prevent damage or breakage of the actuator to achieve stable driving of the stage apparatus.

In addition, a laser interferometer mentioned above is used to measure the position of the fine moving stage. Thus, if the fine moving stage top panel 101 rotates excessively, mirrors 103 to 105 for laser reflection become tilted, preventing the laser from returning to the light receiving portion, which makes the position impossible to measure and control.

Since both an exposure apparatus and a stage apparatus are generally provided with many components such as refrigerant piping for cooling, electric cable and sensor, excessive translational and rotational movements which can damage the components, also become a problem. In particular, in a wafer stage, it is necessary to relatively move an unshown three-pin for wafer replacement in a stroke in the direction of the Z axis relative to the fine moving stage, and when the three-pin is fixed, the fine moving stage can be moved in a stroke in the direction of the Z axis in the order of several millimeters. Thus, one can secure a stroke in the direction of the Z axis and to suppress excessive amounts of translational and rotational movements in the direction of the other axes.

Based on these, with $\theta s$ representing a predetermined stroke and $\theta r$ representing a predetermined control stroke of a stage apparatus in, for example, the rotational direction of a certain axis, the rotatable amount $\theta$ of the stage should be set to satisfy $\theta s \leq \theta \leq \theta r$. In other words, the regulation gap and each of the spans, which serve as parameters for the rotatable amount $\theta$ of the stage, should be set so as to achieve the above-mentioned relationship.

With the above-mentioned configuration, the movable ranges in the direction of the two axes X and Y, as well as in the rotational directions of three axes, $\theta x$, $\theta y$, and $\theta z$, of the fine moving stage can be regulated. In addition, by providing Z regulating members 1z, the movable range in the direction of the Z axis of the fine moving stage can also be regulated. With this, the movable range in a total of six axial directions can be regulated. Thus, damages to a stage apparatus can be prevented or reduced by controlling the amounts of excessive movement while satisfying a desirable stroke for a stage apparatus.

Modified Example

Figure 3A:
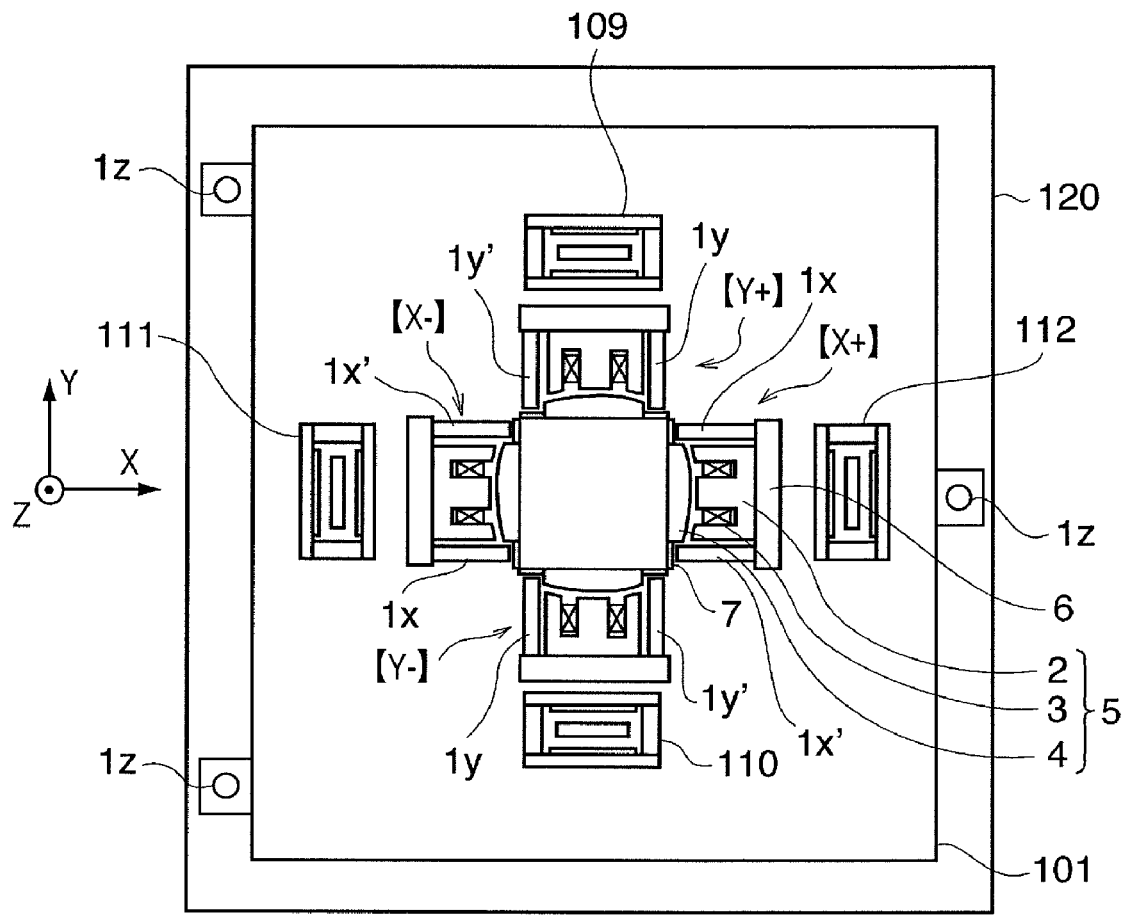
FIG. 3A is a plan view of a stage apparatus according to a variation example of the exemplary embodiment of FIG. 1A.
Figure 3B:
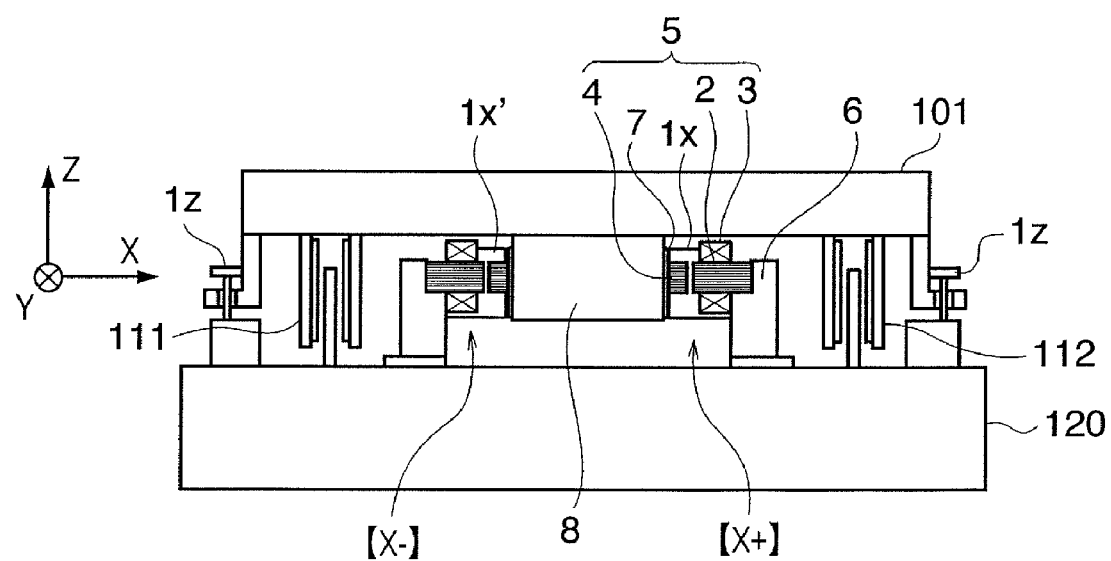
FIG. 3B is a sectional side view of a stage apparatus according to a variation example of the exemplary embodiment of FIG. 1A.

As an example that is a variation of the exemplary embodiment of FIG. 1A, a configuration shown in FIGS. 3A and 3B, can be adopted.

FIGS. 3A and 3B have regulating members 1x' and 1y' added to the configuration shown in FIGS. 1A and 1B so that two each of the regulating members are laid out on the X+ side, the X− side, the Y+ side, and the Y− side. In such a configuration, although regulation is redundant in the direction of the X and Y axes as well as in the rotational directions $\theta x$, $\theta y$, and $\theta z$, the smallest of the amounts of regulation functions as a valid regulating member in that direction. This configuration has an advantage of improving stiffness when restrictions are applied to the regulating members due to space and other reasons. Explanation of the other components are omitted by adding the same numeric references as used in FIGS. 1A and 1B.

Figure 4:
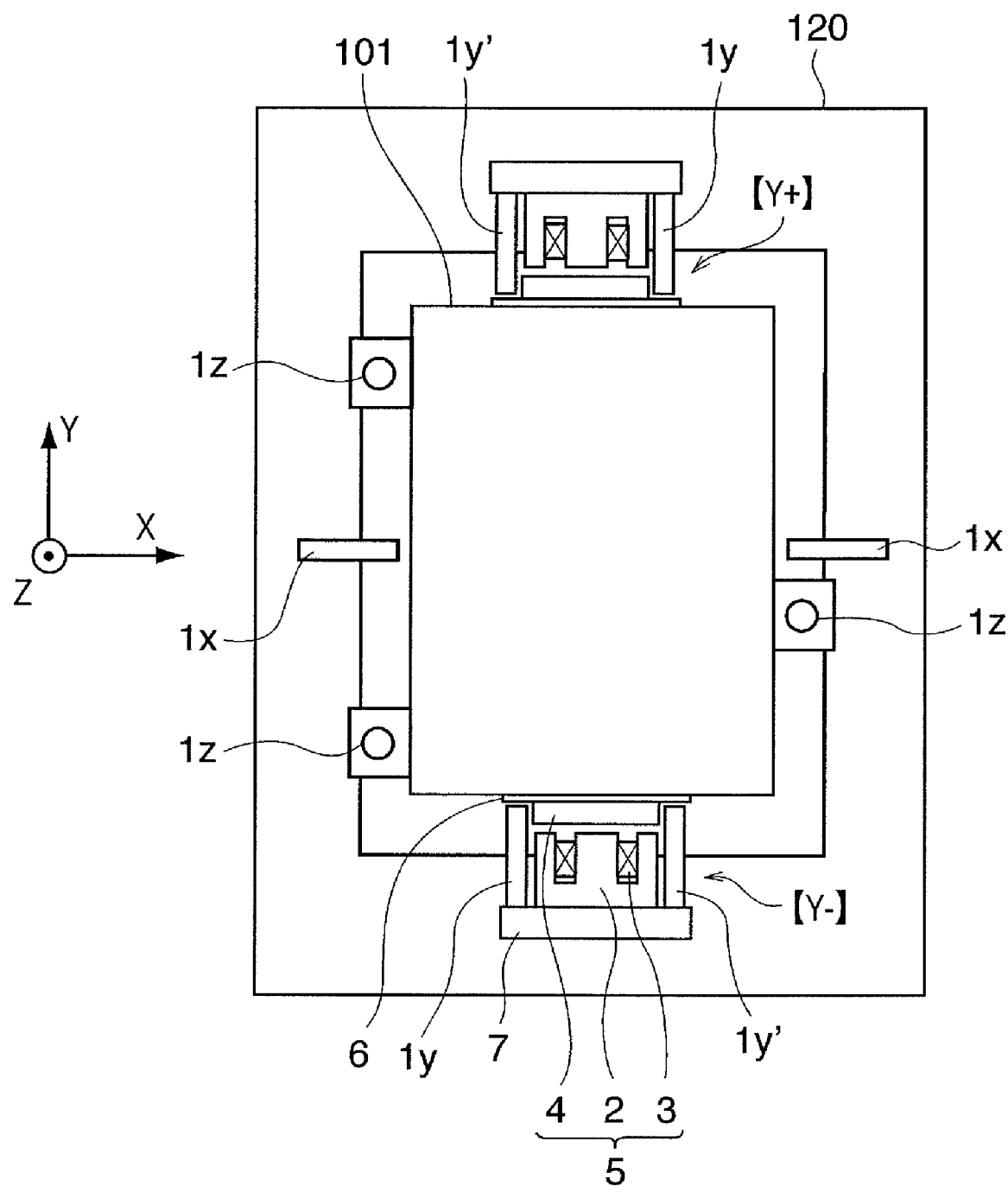
FIG. 4 is a plan view of a stage apparatus according to another variation of the exemplary embodiment of FIG. 1A.

Furthermore, this invention can be applied in the form shown in FIG. 4.

FIG. 4 is a useful form especially as a reticle stage for a semiconductor exposure apparatus in which two electromagnetic actuators 5 are laid out in the direction of the Y axis, more specifically one on the Y+ side and the other on the Y− side. This can generate an attraction in both the + and − sides of the direction of the Y axis, and can give a thrust to a fine moving stage according to acceleration and deceleration of a coarse moving stage. As just described, even when the electromagnetic actuators 5 are provided only in a single axial direction, regulation in the directions of the X and Y axes can be achieved by providing X regulating members 1x and Y regulating members 1y shown in FIG. 4, and regulation in the rotational directions θx and θy can be achieved by forming Z spans. In addition, θz can be regulated with X spans provided to 1y and 1y'. Furthermore, by providing Z regulating members 1z, regulation in a total of six axial directions can be achieved.

Particularly in an apparatus called liquid immersion exposure apparatus, which performs exposures by filling liquid between a projection lens and a wafer, a regulating member in the Z axial direction is important since the gap between the projection lens and the wafer is smaller than the conventional exposure apparatus. In this case, it can be necessary to set a regulation gap of the Z regulating member in a rigorous manner so that the edge portion of the stage and other portions do not contact the projection lens even when the stage is rotated in the θx and θy directions at the top position in the Z direction.

In addition, as shown in FIGS. 1A, 1B, and 2, by supporting the regulating member 1 with the support member 6 that supports the E core 2 so that the dimensional accuracy relative to the E core 2 is managed as a unit, positioning of the E core 2 as a high precision part and the regulating member 1 on the coarse moving stage top panel 120 can be achieved in a collective manner. Similarly, by managing the I core 4 and the support plate 7 as a unit, its relationship with the E core 2 and the regulating member 1 can be handled easily. When laying out the electromagnetic actuator 5 and the regulating member 1 close to each other with such a unitization, the use of a non magnetic material for the regulating member 1 eliminates effects on the thrusts of the electromagnetic actuator.

[Description of Exposure Apparatus]

Figure 10:
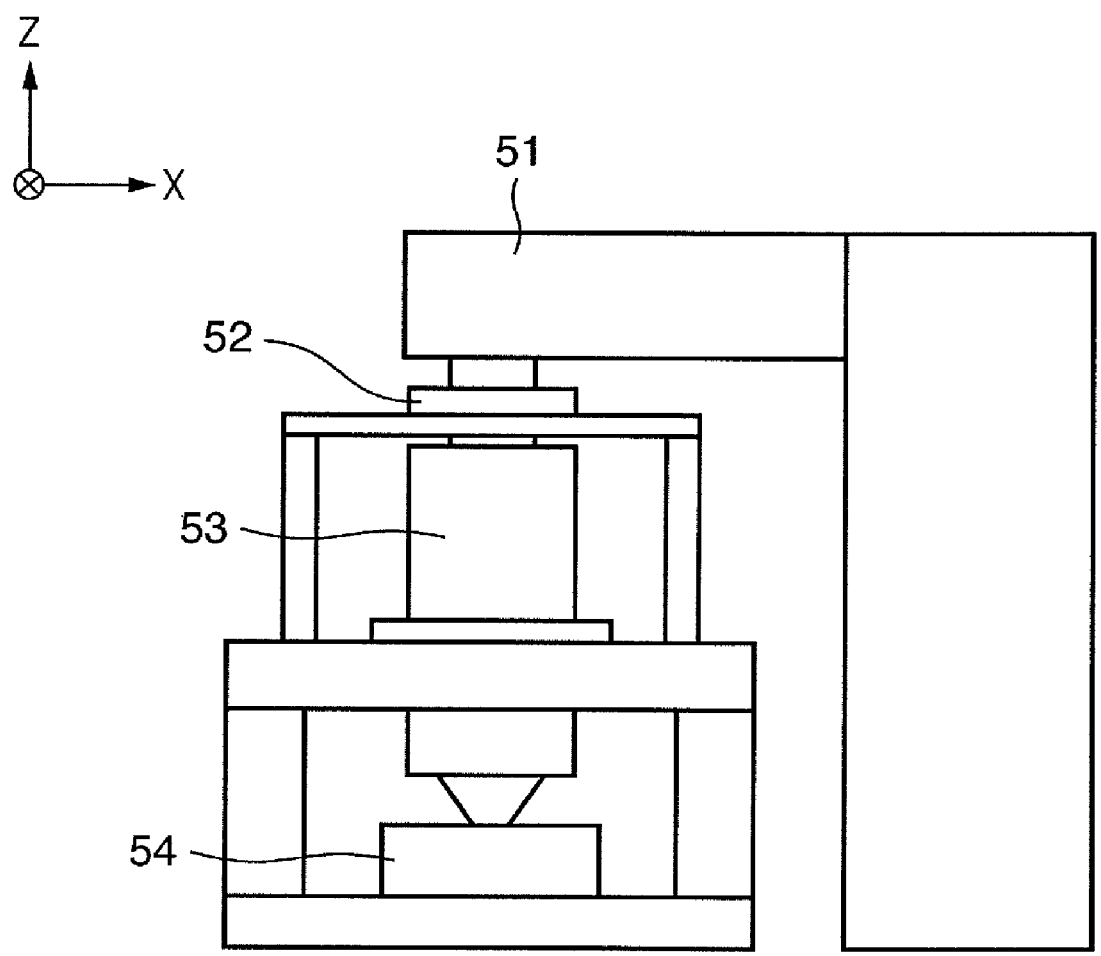
FIG. 10 is a schematic structure diagram of an exposure apparatus according of the exemplary embodiment of FIG. 1A.

FIG. 10 is a schematic structure diagram of a semiconductor exposure apparatus that includes a wafer stage and a reticle stage to which a stage apparatus according to the exemplary embodiment is applied.

As shown in FIG. 10, an exposure apparatus according to the exemplary embodiment is provided with an illumination unit 51 that emits an exposure light, a reticle stage 52 that holds and moves a reticle, a projection optical system 53, and a wafer stage 54 that holds and moves a wafer. The exposure apparatus can be configured to project and expose a circuit pattern formed on a reticle on a wafer, where for the projection and exposure type, a step-and-repeat type and step-and-scan type can be applied.

The illumination unit 51 illuminates a reticle on which a circuit pattern is formed, and has a light source portion and an illumination optical system. In the light source portion, for instance, a laser is used as a light source. As a laser, an ArF excimer laser with a wavelength of about 193 nm, a KrF excimer laser with a wavelength of about 248 nm, or an F2 excimer laser with a wavelength of about 153 nm may be used, but the type of the laser is not limited to excimer lasers, and, for example, YAG lasers may also be used. In addition, there is no limitation in the number of the lasers. When a laser is used as a light source, it is useful to use a beam shaping optical system that shapes a collimated light beam from the laser light source into a useful beam shape or an incoherent optical system that changes a coherent laser beam to an incoherent laser beam. In addition, a light source usable in the light source portion is not limited to lasers, and a single or a plurality of lamps such as mercury lamp and xenon lamp can also be used. The illumination optical system is an optical system that illuminates a reticle and includes a lens, a mirror, a light integrator, and an aperture.

For the projection optical system 53, an optical system that consists solely of a plurality of lens elements, an optical system that has a plurality of lens elements and at least one concave mirror (catadioptric optical system) can be used. Aside these, an optical system that has a plurality of lens elements and at least one diffraction optical element such as kinoform, an all-mirror-type optical system can also be used.

Such an exposure apparatus can be utilized for manufacturing a semiconductor device such as semiconductor integrated circuits, a micro machine, and a device on which a minute pattern is formed such as a thin film magnetic head.

[Method for Manufacturing Device]

Hereinafter, at least one exemplary embodiment for a method for manufacturing a device using the above-mentioned exposure apparatus will be explained.

Figure 11:
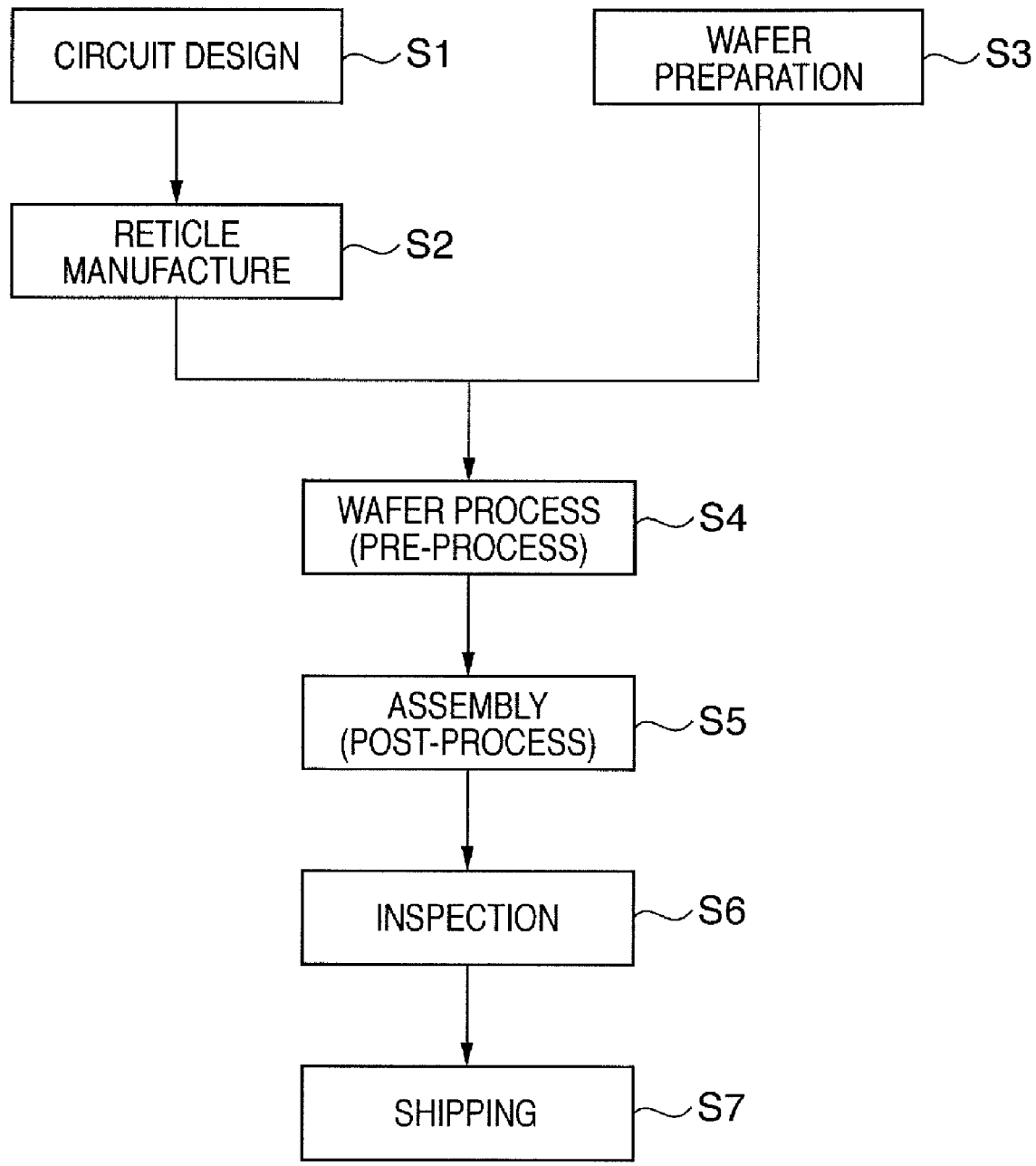
FIG. 11 is a diagram that explains a method for manufacturing a device.

FIG. 11 is a flow chart of a manufacturing process of a micro device (such as semiconductor chip such as IC and LSI, liquid crystal panel, CCD, thin film magnetic head and micro machine). In S1 (circuit design), a circuit of a semiconductor device is designed. In S2 (reticle manufacture), a reticle is manufactured based on the designed circuit pattern. Meanwhile, in S3 (wafer preparation), a wafer is manufactured using a material such as silicon. S4 (wafer process) is referred to as a pre-process in which, using the above-mentioned reticle and wafer, an actual circuit is formed on the wafer with the above-mentioned exposure apparatus with the use of a lithography technology. The subsequent S5 (assembly) is referred to as a post-process in which semiconductor chips are fabricated using wafers produced in S4, and includes an assembly step (dicing and bonding) and a packaging process (chip sealing). In S6 (inspection), inspections such as operation testing and durability testing are performed on the semiconductor device prepared in S5. When a semiconductor device is completed after going through these steps, it is shipped (S7).

Figure 12:
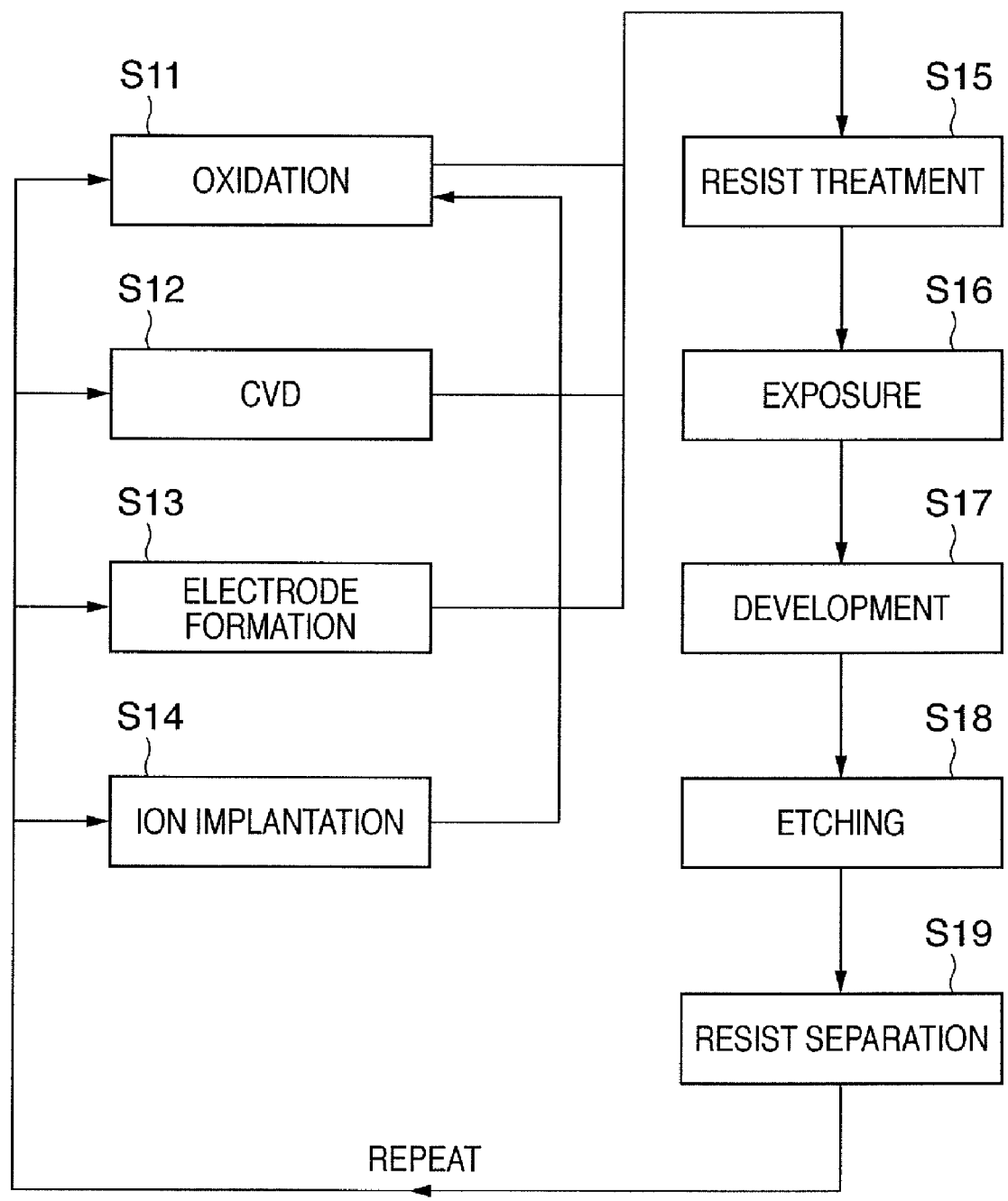
FIG. 12 is a diagram that explains a wafer process.

FIG. 12 is a detailed flow chart of the above-mentioned wafer process. In S11 (oxidation), the surface of the wafer is oxidized. In S12 (CVD), an insulating film is formed on the surface of the wafer. In S13 (electrode formation), an electrode is formed on the wafer through vapor deposition. In S14 (ion implantation), ion is implanted to the wafer. In S15 (resist treatment), a photosensitive agent is applied to the wafer. In S16 (exposure), the circuit pattern of the reticle is exposed and printed on the wafer using the above-explained exposure apparatus. In S17 (development), the exposed wafer is developed. In S18 (etching), portions other than the developed resist images are etched away. In S19 (resist separation), the resists that became unnecessary after completion of etching are removed. Multiply-layered circuit patterns can be formed on the wafer by repeating these steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A stage apparatus having a first stage that is movable with respect to a horizontal plane that is defined by a first axis and a second axis that intersect each other at right angles and a second stage that is movable on the first stage at least in said axial directions and in a rotational direction around a third axis that intersects the horizontal plane, comprising:

a first pair of electromagnetic actuators that are arranged so as to face each other along the first axis, each including an I core and an E core that are arranged between the first and second stages and generate acceleration and deceleration forces of the second stage based on acceleration and deceleration forces of the first stage;

a second pair of electromagnetic actuators that are arranged so as to face each other along the second axis, each including an I core and an E core that are arranged between the first and second stages and generate acceleration and deceleration forces of the second stage based on acceleration and deceleration forces of the first stage;

a first pair of regulating members that face with each other and arranged in parallel with the first axis and are spaced away from each other by a predetermined distance in the second axis; and a second pair of regulating members that face with each other and arranged in parallel with the second axis and are spaced away from each other by a predetermined distance in the first axis, wherein a movement of the second stage in the first axis direction, a rotation of the second stage around the second axis and one of clockwise and counterclockwise rotations of the second stage around the third axis are regulated by the first pair of regulating members, wherein a movement of the second stage in the second axis direction, a rotation of the second stage around the first axis and the other one of clockwise and counterclockwise rotations of the second stage around the third axis are regulated by the second pair of regulating members, and wherein the movement of the second stage in the first and second axis directions, the rotation of the second stage around the first and second axes and both of clockwise and counterclockwise rotation of the second stage around the third axis are regulated by four of the regulating members.

2. The stage apparatus according to claim 1, wherein the first and second pair of regulating members are arranged to the E core supporting member so as to make a gap to the I core supporting member, and the gap is set to be larger than the moving amount of the second stage relative to the first stage.

3. An exposure apparatus for exposing a pattern image of a reticle to a substrate through a projection optical system comprising:

an illumination unit that illuminates the reticle so that the pattern image is formed; and the stage apparatus according to claim 1, wherein at least one of the substrate and the reticle is moved by the stage apparatus for exposure.

4. A device manufacturing method comprising:

exposing a substrate through a reticle using the exposure apparatus according to claim 3;

developing the exposed substrate; and manufacturing a device by processing the developed substrate.

* * * * *